US012588146B2

(12) United States Patent
Yu et al.

(10) Patent No.: US 12,588,146 B2
(45) Date of Patent: Mar. 24, 2026

(54) CLUSTERED MICROVIA STRUCTURE FOR A HIGH-DENSITY INTERFACE PCB

(71) Applicant: NVIDIA CORPORATION, Santa Clara, CA (US)

(72) Inventors: Mingyi Yu, Saratoga, CA (US); Gregory Patrick Bodi, Santa Cruz, CA (US); Ananta H. Attaluri, San Jose, CA (US); Duy Nguyen, Rohnert Park, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 134 days.

(21) Appl. No.: 17/895,995

(22) Filed: Aug. 25, 2022

(65) Prior Publication Data

US 2024/0074053 A1     Feb. 29, 2024

(51) Int. Cl.
*H05K 1/11*          (2006.01)
*H05K 1/181*         (2026.01)

(52) U.S. Cl.
CPC ............. *H05K 1/113* (2013.01); *H05K 1/181* (2013.01)

(58) Field of Classification Search
CPC ................................ H05K 1/113; H05K 1/118

USPC .......................................................... 361/774
See application file for complete search history.

(56) References Cited

U.S. PATENT DOCUMENTS

| | | | | |
|---|---|---|---|---|
| 9,299,649 B2 * | 3/2016 | Chiu | .................... | H01L 21/6835 |
| 2005/0156319 A1 * | 7/2005 | Oggioni | .............. | H05K 1/0251 |
| | | | | 257/774 |
| 2015/0189751 A1 * | 7/2015 | Akahoshi | ............. | H05K 3/4661 |
| | | | | 174/262 |
| 2017/0018478 A1 * | 1/2017 | Maple | .................... | H01L 21/486 |
| 2020/0111680 A1 * | 4/2020 | Fillion | .................... | H01L 21/56 |
| 2023/0199958 A1 * | 6/2023 | Trelford | .............. | H05K 3/0038 |
| | | | | 174/257 |
| 2023/0209710 A1 * | 6/2023 | Song | ..................... | H05K 3/429 |
| | | | | 174/250 |

* cited by examiner

*Primary Examiner* — Timothy J Thompson
(74) *Attorney, Agent, or Firm* — Artegis Law Group, LLP

(57) ABSTRACT

According to various embodiments, a printed circuit board includes: a buried via formed through one or more layers of the printed circuit board; a first conductive pad that is formed on a first end of the buried via; a first conductive via that is formed through a first layer of the printed circuit board and is connected to the first conductive pad; and a second conductive via that is formed through the first layer of the printed circuit board and is connected to the first conductive pad.

17 Claims, 6 Drawing Sheets

CLUSTERED MICROVIA STRUCTURE FOR A HIGH-DENSITY INTERFACE PCB

FIELD OF THE VARIOUS EMBODIMENTS

The various embodiments relate generally to computer architecture and electronics and, more specifically, to a clustered microvia structure for a high-density interface printed circuit board.

DESCRIPTION OF THE RELATED ART

Printed circuit boards (PCBs) enable the integration of multiple electronic components, such as separately packaged integrated circuits (ICs), capacitors, resistors, voltage regulators, and other electronic components, into a single compact assembly. Such assemblies oftentimes are referred to as printed circuit board assemblies (PCBAs) and are used in a wide range of communication and computing implementations, including, and without limitation, mobile phones, laptop computers, desktop computers, and server machines.

Among other things, a PCB provides an electrical interface for routing input and output signals, power connections, and ground connections between the various integrated circuits mounted on the PCB and/or edge connector pins formed on an edge of the PCB. Typically, the routing of signals and power connections within a PCB is carried out with electrically conductive interconnects formed on the surfaces of the PCB and within the layers of the PCB, such as metallic traces, plated vias, and power and ground planes. The metallic traces perform such routing "horizontally" within the PCB, i.e., along the surfaces of the PCB and/or within the internal layers of the PCB. By contrast, vias perform such routing "vertically" within the PCB, i.e., from one layer of the PCB to another. For example, a via can route power from a voltage regulator module mounted on a surface of the PCB to a power plane formed within the layers of the PCB.

One drawback of conventional PCB vias is that, in high-performance implementations, routing a sufficient amount of power to certain electronic components mounted on a PCB can be challenging. For instance, in implementations where a high-performance processor, such as a central processing unit (CPU) or graphics processing unit (GPU), is mounted on a PCB, the number of power connections to the processor is typically limited, which reduces the overall amount of power that can be delivered to the processor. Further, the maximum amperage that can be routed to each power connection through an individual via is also limited, particularly for high density interconnect (HDI) microvias that are required for CPUs and GPUs, which reduces the amount of power that can be delivered to the processor through a given power connection. Consequently, as power consumption of high-performance ICs increases, conventional PCBs may be unable to route sufficient power to such ICs.

As the foregoing illustrates, what is needed in the art are more effective techniques for routing power to high-performance integrated circuits that are mounted on printed circuit boards.

SUMMARY

According to various embodiments, a printed circuit board includes: a buried via formed through one or more layers of the printed circuit board; a first conductive pad that is formed on a first end of the buried via; a first conductive via that is formed through a first layer of the printed circuit board and is connected to the first conductive pad; and a second conductive via that is formed through the first layer of the printed circuit board and is connected to the first conductive pad.

At least one technical advantage of the disclosed design relative to the prior art is that the disclosed design enables more power to be routed to a given power connection of an IC that is mounted on a PCB. In this regard, because a cluster of multiple microvias is aligned with a single through-hole via and acts as a single conductive element in the disclosed design, the quantity of power that can be routed through the single through-hole via is multiplied by the number of microvias in the cluster. As a result, the power that can be routed through a single through-hole via to the given power connection of the IC can be substantially increased relative to what can be achieved with prior art designs. These technical advantages provide one or more technological advancements over prior art approaches.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

For clarity, identical reference numbers have been used, where applicable, to designate identical elements that are common between figures. It is contemplated that features of one embodiment may be incorporated in other embodiments without further recitation.

DETAILED DESCRIPTION

In the following description, numerous specific details are set forth to provide a more thorough understanding of the various embodiments. However, it will be apparent to one of skilled in the art that the inventive concepts may be practiced without one or more of these specific details.

System Overview

Figure 1:
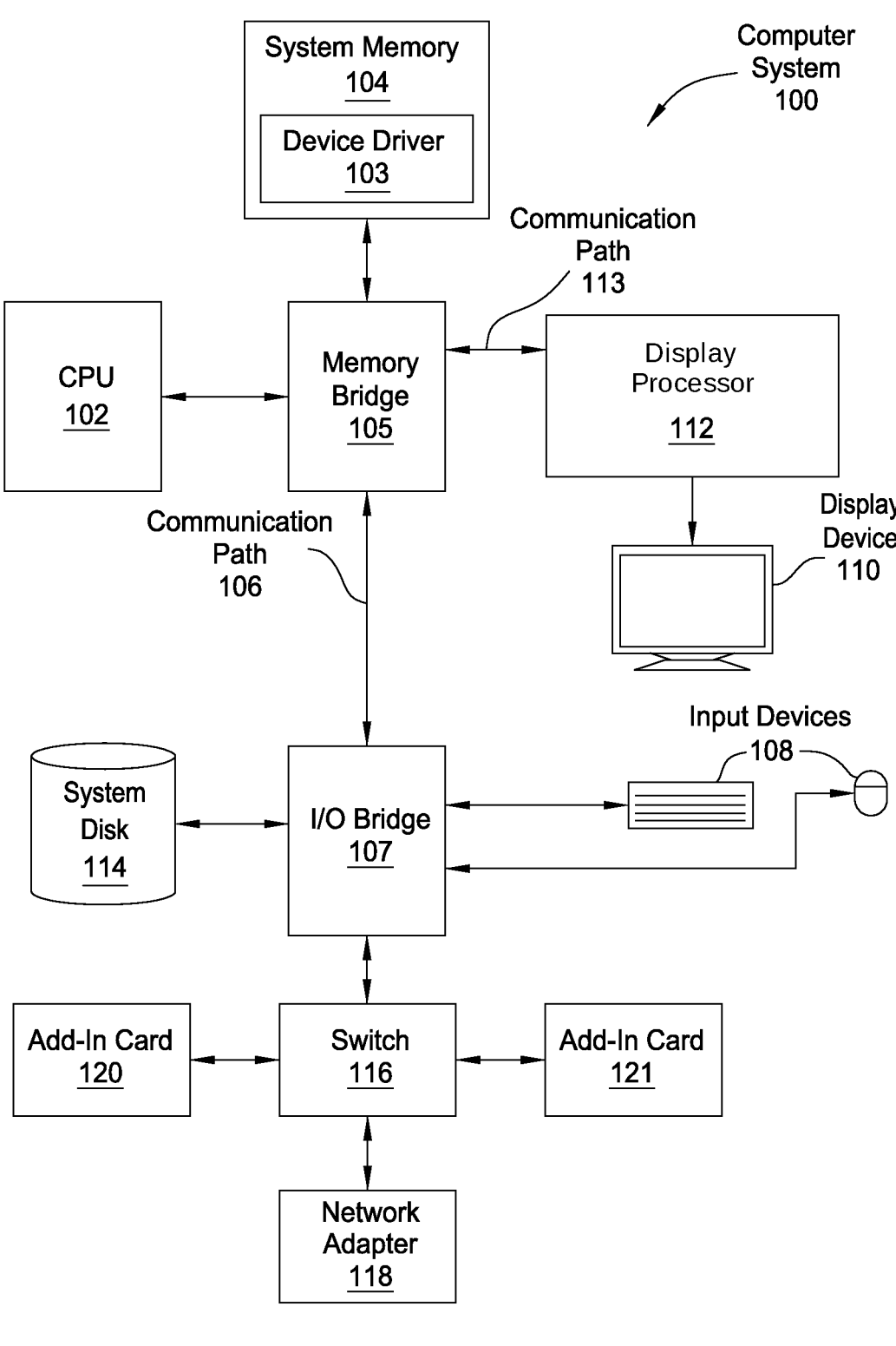
FIG. 1 is a conceptual illustration of a computer system configured to implement one or more aspects of the various embodiments.

FIG. 1 is a conceptual illustration of a computer system 100 configured to implement one or more aspects of the various embodiments. As shown, computer system 100 includes a central processing unit (CPU) 102 and a system memory 104 communicating via a bus path that may include a memory bridge 105. CPU 102 includes one or more processing cores, and, in operation, CPU 102 is the master processor of computer system 100, controlling and coordinating operations of other system components. System memory 104 stores software applications and data for use by CPU 102. CPU 102 runs software applications and optionally an operating system. Memory bridge 105, which may be, e.g., a Northbridge chip, is connected via a bus or other communication path (e.g., a HyperTransport link) to an I/O (input/output) bridge 107. I/O bridge 107, which may be, e.g., a Southbridge chip, receives user input from one or more user input devices 108 (e.g., keyboard, mouse, joystick, digitizer tablets, touch pads, touch screens, still or video cameras, motion sensors, and/or microphones) and forwards the input to CPU 102 via memory bridge 105.

A parallel processing subsystem 112 is coupled to memory bridge 105 via a bus or other communication path (e.g., a PCI Express, Accelerated Graphics Port, or Hyper-Transport link); in one embodiment parallel processing subsystem 112 is a graphics subsystem that includes at least one graphics processing unit (GPU) and graphics memory. Graphics memory includes a display memory (e.g., a frame buffer) used for storing pixel data for each pixel of an output image. Graphics memory can be integrated in the same device as the GPU, connected as a separate device with the GPU, and/or implemented within system memory 104.

Parallel processing subsystem 112 periodically delivers pixels to a display device 110 (e.g., a screen or conventional CRT, plasma, OLED, SED or LCD based monitor or television). Additionally, parallel processing subsystem 112 may output pixels to film recorders adapted to reproduce computer generated images on photographic film. Parallel processing subsystem 112 can provide display device 110 with an analog or digital signal. In various embodiments, a graphical user interface is displayed to one or more users via display device 110, and the one or more users can input data into and receive visual output from the graphical user interface.

A system disk 114 is also connected to I/O bridge 107 and may be configured to store content and applications and data for use by CPU 102 and parallel processing subsystem 112. System disk 114 provides non-volatile storage for applications and data and may include fixed or removable hard disk drives, flash memory devices, and CD-ROM, DVD-ROM, Blu-ray, HD-DVD, or other magnetic, optical, or solid state storage devices.

A switch 116 provides connections between I/O bridge 107 and other components such as a network adapter 118 and various add-in cards 120 and 121. Network adapter 118 allows computer system 100 to communicate with other systems via an electronic communications network, and may include wired or wireless communication over local area networks and wide area networks such as the Internet.

Other components (not shown), including USB or other port connections, film recording devices, and the like, may also be connected to I/O bridge 107. For example, an audio processor may be used to generate analog or digital audio output from instructions and/or data provided by CPU 102, system memory 104, or system disk 114. Communication paths interconnecting the various components in FIG. 1 may be implemented using any suitable protocols, such as PCI (Peripheral Component Interconnect), PCI Express (PCI-E), AGP (Accelerated Graphics Port), HyperTransport, or any other bus or point-to-point communication protocol(s), and connections between different devices may use different protocols, as is known in the art.

In one embodiment, parallel processing subsystem 112 incorporates circuitry optimized for graphics and video processing, including, for example, video output circuitry, and constitutes a graphics processing unit (GPU). In another embodiment, parallel processing subsystem 112 incorporates circuitry optimized for general purpose processing. In yet another embodiment, parallel processing subsystem 112 may be integrated with one or more other system elements, such as the memory bridge 105, CPU 102, and I/O bridge 107 to form a system on chip (SoC). In still further embodiments, parallel processing subsystem 112 is omitted and software executed by CPU 102 performs the functions of parallel processing subsystem 112.

Pixel data can be provided to parallel processing subsystem 112 directly from CPU 102. In some embodiments, instructions and/or data representing a scene are provided to a render farm or a set of server computers, each similar to computer system 100, via network adapter 118 or system disk 114. The render farm generates one or more rendered images of the scene using the provided instructions and/or data. These rendered images may be stored on computer-readable media in a digital format and optionally returned to computer system 100 for display. Similarly, stereo image pairs processed by parallel processing subsystem 112 may be output to other systems for display, stored in system disk 114, or stored on computer-readable media in a digital format.

Alternatively, CPU 102 provides parallel processing subsystem 112 with data and/or instructions defining the desired output images, from which parallel processing subsystem 112 generates the pixel data of one or more output images, including characterizing and/or adjusting the offset between stereo image pairs. The data and/or instructions defining the desired output images can be stored in system memory 104 or graphics memory within parallel processing subsystem 112. In an embodiment, parallel processing subsystem 112 includes 3D rendering capabilities for generating pixel data for output images from instructions and data defining the geometry, lighting shading, texturing, motion, and/or camera parameters for a scene. Parallel processing subsystem 112 can further include one or more programmable execution units capable of executing shader programs, tone mapping programs, and the like.

Further, in other embodiments, CPU 102 or parallel processing subsystem 112 may be replaced with or supplemented by any technically feasible form of processing device configured process data and execute program code. Such a processing device could be, for example, a central processing unit (CPU), a graphics processing unit (GPU), an application-specific integrated circuit (ASIC), a field-programmable gate array (FPGA), and so forth. In various embodiments any of the operations and/or functions described herein can be performed by CPU 102, parallel processing subsystem 112, or one or more other processing devices or any combination of these different processors.

CPU 102, a render farm, and/or parallel processing subsystem 112 can employ any surface or volume rendering technique known in the art to create one or more rendered images from the provided data and instructions, including rasterization, scanline rendering REYES or micropolygon rendering, ray casting, ray tracing, image-based rendering techniques, and/or combinations of these and any other rendering or image processing techniques known in the art.

In other contemplated embodiments, computer system 100 may or may not include other elements shown in FIG.

1. System memory 104 and/or other memory units or devices in computer system 100 may include instructions that, when executed, cause the robot or robotic device represented by computer system 100 to perform one or more operations, steps, tasks, or the like.

It will be appreciated that the computer system shown herein is illustrative and that variations and modifications are possible. The connection topology, including the number and arrangement of bridges, may be modified as desired. For instance, in some embodiments, system memory 104 is connected to CPU 102 directly rather than through a bridge, and other devices communicate with system memory 104 via memory bridge 105 and CPU 102. In other alternative topologies parallel processing subsystem 112 is connected to I/O bridge 107 or directly to CPU 102, rather than to memory bridge 105. In still other embodiments, I/O bridge 107 and memory bridge 105 might be integrated into a single chip. The particular components shown herein are optional; for instance, any number of add-in cards or peripheral devices might be supported. In some embodiments, switch 116 is eliminated, and network adapter 118 and add-in cards 120, 121 connect directly to I/O bridge 107.

PCBA with Multi-Layer Via

Figure 2:
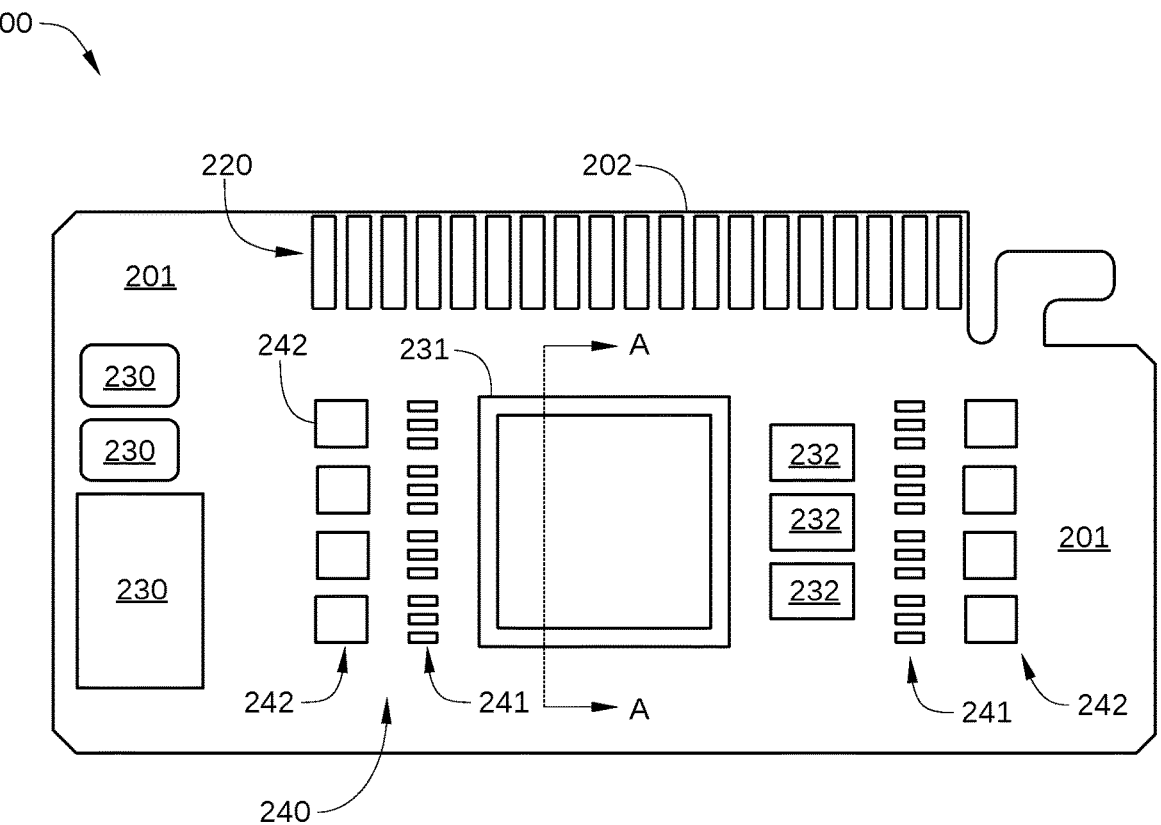
FIG. 2 is a schematic illustration of a printed circuit board assembly that can be incorporated into the computer system of FIG. 1, according to various embodiments.

FIG. 2 is a schematic illustration of a PCBA 200 that can be incorporated into computer system 100, according to various embodiments. PCBA 200 is a PCB-based module or other PCB-based device and has multiple integrated circuits (ICs) 230 and/or electronic devices 240 included therein. In some embodiments, PCBA 200 is configured as an add-in card, such as a network interface controller, a graphics card, a CPU card, a single-board computer card, a server CPU card, a server storage card, and the like. Alternatively, in some embodiments, PCBA 200 is configured as a component of a computer system, such as a motherboard of computer system 100, a PCB-based module of a mobile phone or game console, and the like.

In some embodiments, one or more of the functional modules of computer system 100 of FIG. 1 can be implemented as a PCB-based device using an embodiment of PCBA 200. In such embodiments, functional modules of computer system 100 so implemented include CPU 102, system memory 104, parallel processing subsystem 112, network adapter 118, and/or add-in cards 120 and 121. In some embodiments, multiple functional modules of computer system 100 are implemented as a single PCBA 200. Alternatively or additionally, in some embodiments, a single functional module of computer system 100 is implemented as a single PCBA 200.

PCBA 200 includes a PCB 201 on which various ICs 230 and electronic devices 240 are mounted. In some embodiments, PCB 201 further includes a plurality of edge connector pins 220 formed on an edge 202 of PCB 201. ICs 230 and/or electronic devices 240 may be communicatively coupled to edge connector pins 220 and/or each other by any technically feasible electrical connection known in the art, including a ball-grid array (BGA), a pin-grid array (PGA), wire bonding, electrical traces, vias, and/or the like. In the embodiment illustrated in FIG. 2, various ICs 230 and electronic devices 240 are mounted on a front side of PCB 201. In other embodiments, one or more ICs and/or power components are also mounted on a back side of PCB 201, such as back-side-mounted memory devices.

PCB 201 is a rigid and electrically insulating multi-layer substrate that provides PCBA 200 with structural rigidity and enables ICs 230 and electronic devices 240 to be integrated into a single module or device. Thus, in some embodiments, PCB 201 enables PCBA 200 to be assembled as part of a server machine, desktop computer, and the like. For example, PCB 201 can be configured for insertion into a suitable interface or slot of a backplane, a peripheral component interconnect express (PCIe) slot of a motherboard, and/or the like. In some embodiments, PCB 201 includes a laminate substrate and is composed of a stack of insulative layers or laminates that are built up on the top and bottom surfaces of a core layer. The laminate substrate of PCB 201 can include any materials suitable for use in a PCB, including a phenolic paper substrate (e.g., FR-2, an epoxy paper substrate (e.g., CEM-1 and/or FR-3), an epoxy fiberglass board (e.g., FR-4, FR-5, G-10, and/or G-11), a nonwoven glass fiber polyester substrate (e.g., FR-6), a PI polyacrylamide resin base material, and/or the like.

PCB 201 also provides an electrical interface, via electrical traces and vias (not shown), for routing I/O signals, power, and ground connections between ICs 230, electronic devices 240, and/or edge connector pins 220. Edge connector pins 220 provide electrical connections between the ICs 230 and electronic devices 240 of PCBA 200 and other devices external to PCBA 200, such as other PCB-based modules (not shown) of a computing device that includes PCBA 200. For example, such PCB-based modules may include one or more sound cards, graphics cards, network interface cards, and/or the like.

In some embodiments, PCB 201 is configured as a high-density interface (HDI) PCB, and therefore has a higher wiring density per unit area than other PCBs. Generally, HDI PCBs have increased interconnection density and enable finer-pitch ball-grid arrays (BGAs) for mounting ICs onto the PCB, for example using microvias to route signals and power between multiple buildup layers or other signal layers of the PCB. Generally, HCl PCBs have enhanced electrical performance and reduced size compared to standard PCBs. As a result, HDI PCBs are often employed for high-powered processors, such as CPUs and GPUs.

ICs 230 may include one or more processors, memory devices, a solid state drive (SSD), an SOC, and/or the like. The processor or processors can be a high-powered processor, such as CPU 102 and/or parallel processing subsystem 112 of FIG. 1, or any other technically feasible processor or integrated circuit. In the embodiment illustrated in FIG. 2, ICs 230 include a high-power IC 231, such as a CPU or a GPU, and a plurality of memory devices 232 mounted on the front side of PCB 201 proximate high-power IC 231. Electronic devices 240 may include one or more power regulators or other power-supplying devices, such as a plurality of capacitors 241 and/or a plurality of voltage regulator modules 242. Alternatively or additionally, in some embodiments, electronic devices 240 include other electronic devices mounted on a front side or back side of PCB 201, such as resistors, and/or the like.

Figure 3:
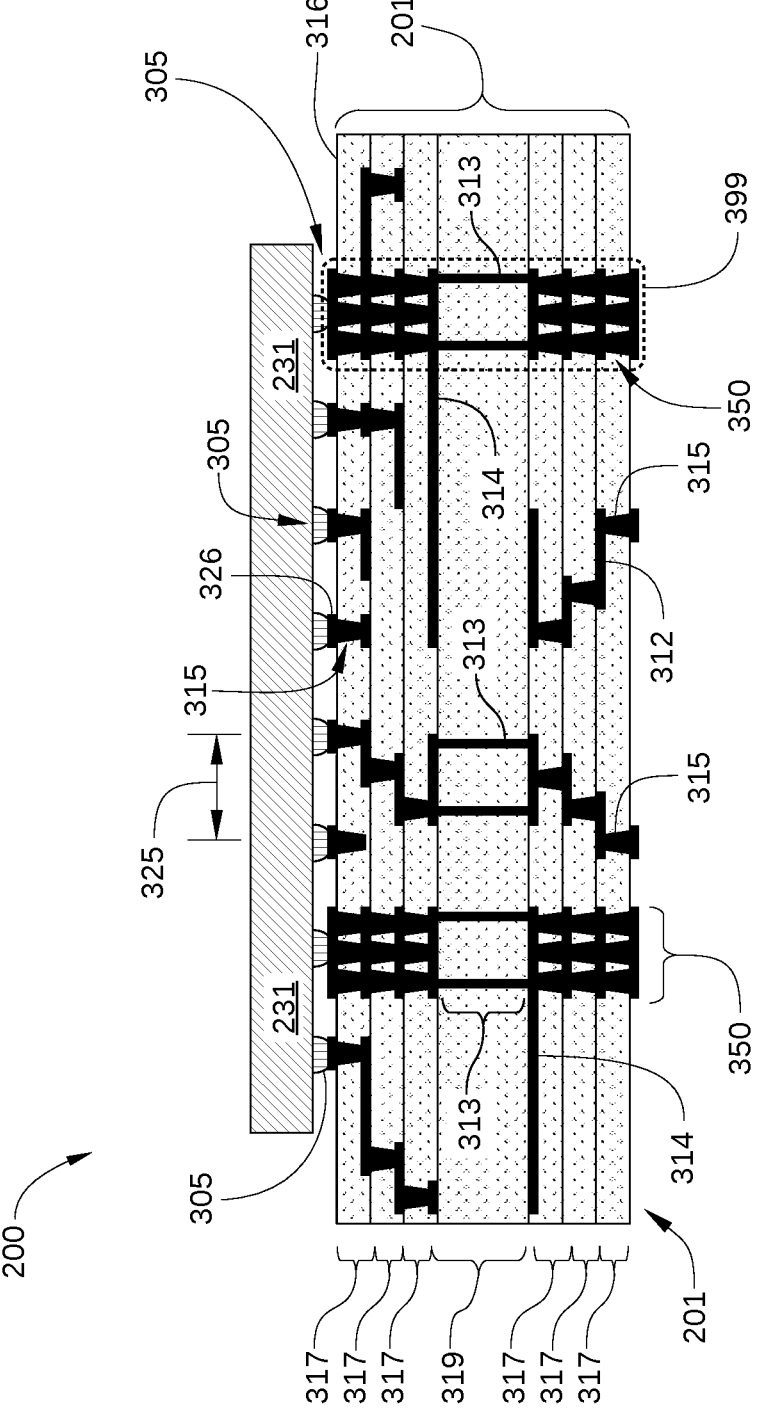
FIG. 3 is a cross-sectional view of the printed circuit board assembly of FIG. 2, according to various embodiments.

FIG. 3 is a cross-sectional view of PCBA 200, according to various embodiments. The cross-sectional view of FIG. 3 is taken at section A-A of FIG. 2, and includes high-power IC 231. As shown, high-power IC 231 is mounted on a top surface 301 of PCB 201 and is electrically connected to PCB 201 with a plurality of electrical connections 305. Electrical connections 305 can include any technically feasible electrical connection known in the art, including a ball-grid array (BGA), a pin-grid array (PGA), and the like.

In the embodiment illustrated in FIG. 3, PCB 201 includes a core layer 319 and multiple buildup layers 317. For example, as shown in FIG. 3, buildup layers 317 are insulative layers or laminates that are built up on the top and bottom surfaces of core layer 119. Alternatively, in some embodiments, one or more buildup layers 317 may be formed on one side of core layer 319 and no buildup layers 317 may be formed on the other side of core layer 319. Core layer 319 is a rigid layer of PCB 201, such as an FR-4 substrate, on which laminate layers are added to form one or more buildup layers 317. Generally, core layer 319 is thicker than any individual buildup layer 317 of PCB 201. In other embodiments, PCB 201 includes no core layer 319, and in yet other embodiments, PCB 201 includes multiple core layers 319. In the latter case, the multiple core layers 319 may be separated by one or more additional buildup layers 317.

In addition, PCB 201 includes electrically conductive interconnects for routing I/O signals and power and ground connections. For example, such interconnects route input and output signals, power connections, and ground connections between ICs mounted on PCB 201, such as high-power IC 231, and power components mounted on PCB 201, such as power regulators and/or other power-supplying devices (not visible in FIG. 3). Examples of such electrically conductive interconnects include metallic traces 312, through-hole vias 313, power or ground planes 314, and/or microvias 315. Each of metallic traces 312 and power or ground planes 314 is formed on a surface of or within a buildup layer 317 of PCB 201. Through-hole vias 313 are formed through core layer 319 and/or one or more adjacent buildup layers 317, and therefore route I/O signals and/or power and ground connections through core layer 319 and, in some instances, additional layers of PCB 201. Through-hole vias 313 can be plated through-hole vias or any other technically feasible through-hole via formed through one or more layers of PCB 201, such as core layer 319 or core layer 319 and one or more buildup layers 317 that are contiguous with core layer 319. In some instances, through-hole vias 313 are blind vias, as shown in FIG. 3.

Microvias 315 are generally formed through one or more contiguous buildup layers 317, and therefore route I/O signals and/or power and ground connections between two or more layers of PCB 201. To facilitate use in an HDI PCB, microvias are typically formed with a smaller diameter than standard vias, such as through-hole vias 313. For example, microvias 315 often have a diameter of less than about 0.5 mm. In the embodiment illustrated in FIG. 3, a microvia 315 that is formed on a surface layer 316 of PCB 201 is placed in a conductive landing pad 326, allowing a smaller pitch 325 for electrical connections 305 of high-power IC 231.

Figure 4:
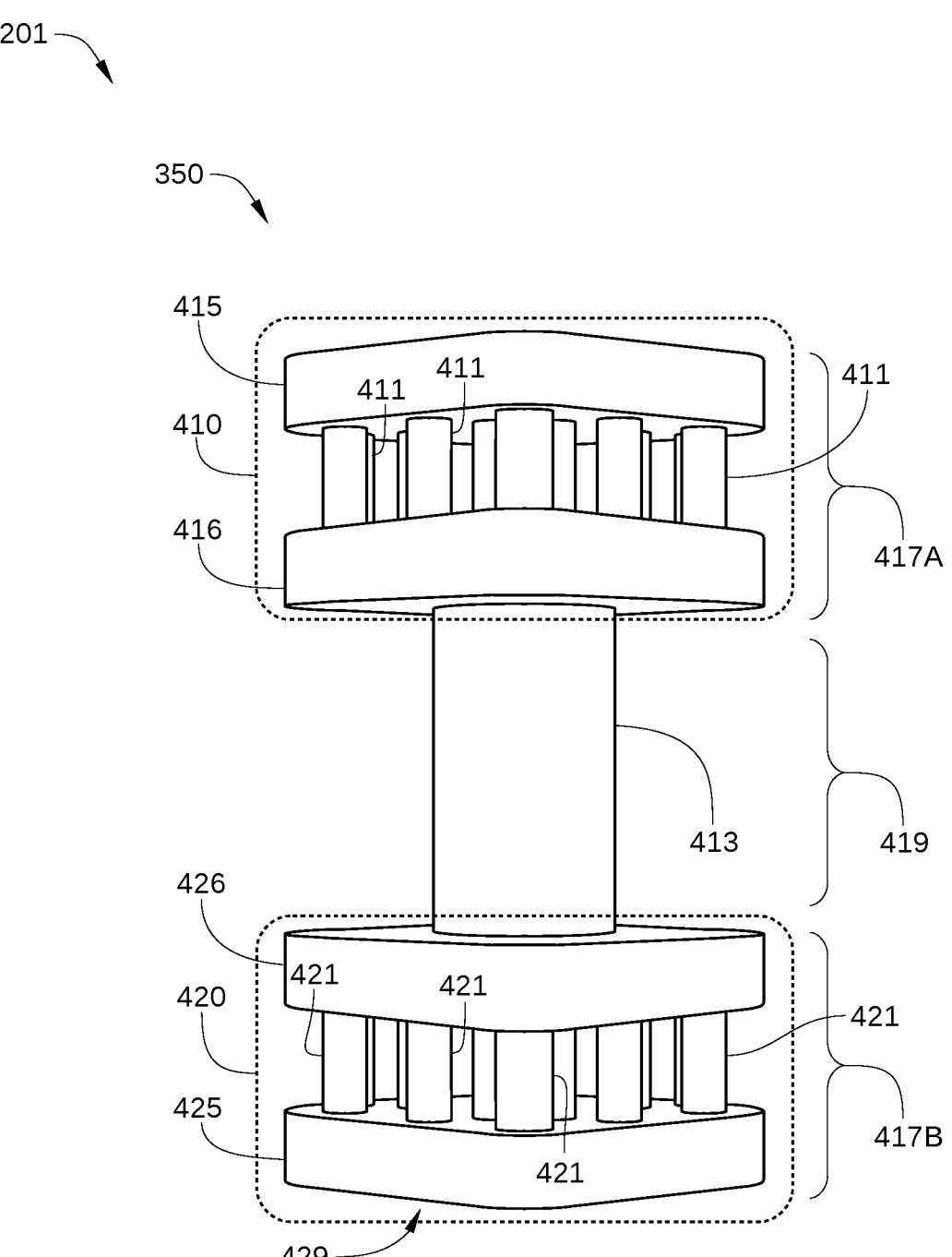
FIG. 4 is more detailed an illustration of a multi-layer via that can be included in the printed circuit board assembly of FIG. 2, according to various embodiments.

Top clustered microvia structure 410 includes a plurality of microvias 411 that are formed through one or more top buildup layers 417A of PCB 201. In the embodiment illustrated in FIG. 4, microvias 411 are formed through a single top buildup layer 417A, which is an exposed layer of PCB 201 on which ICs are mounted. Further, in the embodiment illustrated in FIG. 4, each microvia 411 is connected to a first conductive pad 415 and a second conductive pad 416. As shown, first conductive pad 415 is disposed on or formed within a surface of top buildup layer 417A and can be a contact pad, for example for a solder ball or other electrical connection to an IC. By contrast, second conductive pad 416 is formed from a transition layer of PCB 201, where the transition layer is a buildup layer adjacent to core layer 419. As a result, top clustered microvia structure 410 operates as a single electrically conductive interconnect from top buildup layer 417A to through-hole via 413. Unlike a convention microvia formed through top buildup layer 417A, top clustered microvia structure 410 has many times the current-conducting capacity without significantly increasing the footprint of first conductive pad 415.
Multi-Layer Via with Clustered Microvia Structure FIG. 4 is a more detailed illustration of multi-layer via 350 that can be included in the printed circuit board assembly of FIG. 2, according to various embodiments. Multi-layer via 350 includes at least one clustered microvia structure that includes multiple microvias. In the embodiment illustrated in FIG. 4, multi-layer via 350 includes a top clustered microvia structure 410 that includes microvias 411 and a bottom clustered microvia structure 420 that includes microvias 421. Microvias 411 are formed through one or more top buildup layers 417A of PCB 201 and microvias 421 are formed through one or more bottom buildup layers 417B of PCB 201. Multi-layer via 350 further includes, in some embodiments, a through-hole via 413 that is formed through a core layer 419 of PCB 201, such as a plated through-hole. In such embodiments, top clustered microvia structure 410 is formed at a first end of through-hole via 413 and bottom clustered microvia structure 420 is formed at a second end of through-hole via 413. For clarity, only the locations of top buildup layer 417A, bottom buildup layer, and core layer 419 are shown in FIG. 4.

Top clustered microvia structure 410 includes a plurality of microvias 411 that are formed through one or more top buildup layers 417A of PCB 201. In the embodiment illustrated in FIG. 4, microvias 411 are formed through a single top buildup layer 417A, which is an exposed layer of PCB 201 on which ICs are mounted. Further, in the embodiment illustrated in FIG. 4, each microvia 411 is connected to a first conductive pad 415 and a second conductive pad 416. As shown, first conductive pad 415 is disposed on or formed within a surface of top buildup layer 417A and can be a contact pad, for example for a solder ball or other electrical connection to an IC. By contrast, second conductive pad 416 is formed from a transition layer 412 of PCB 201, where transition layer 412 is adjacent to core layer 419. As a result, top clustered microvia structure 410 operates as a single electrically conductive interconnect from top buildup layer 417A to through-hole via 413. Unlike a convention microvia formed through top buildup layer 417A, top clustered microvia structure 410 has many times the current-conducting capacity without significantly increasing the footprint of first conductive pad 415.

In some embodiments, some or all of microvias 411 are filled with electrically conductive material. Thus, unlike conventional microvias, the complete cross-section of such microvias 411 is employed in transmitting electrical current between various layers of PCB 201. As a result, each such microvia 411 can transmit more electrical current than a single conventional microvia having the same diameter.

Bottom clustered microvia structure 420 is similar in configuration to top clustered microvia structure 410, and includes a plurality of microvias 421 that are formed through one or more bottom buildup layers 417B of PCB 201. In the embodiment illustrated in FIG. 4, microvias 421 are formed through a single bottom buildup layer 417B, which is an exposed layer of PCB 201. In some embodiments, ICs and/or power devices are mounted on exposed surface 429 of bottom buildup layer 417B. In the embodiment illustrated in FIG. 4, each microvia 421 is connected to a first conductive pad 425 and a second conductive pad 426 that is formed from a transition layer of PCB 201. As a result, bottom clustered microvia structure 420 operates as a single electrically conductive interconnect from bottom buildup layer 417B to through-hole via 413. In some embodiments, first conductive pad 425 is disposed on exposed surface 429 of bottom buildup layer 417B or formed within bottom buildup layer 417B, and second conductive pad 426 is formed from a transition layer of PCB 201.

Bottom clustered microvia structure 420 is similar in configuration to top clustered microvia structure 410, and includes a plurality of microvias 421 that are formed through one or more bottom buildup layers 417B of PCB 201. In the embodiment illustrated in FIG. 4, microvias 421 are formed through a single bottom buildup layer 417B, which is an exposed layer of PCB 201. In some embodiments, ICs and/or power devices are mounted on exposed surface 429 of bottom buildup layer 417B. In the embodiment illustrated in FIG. 4, each microvia 421 is connected to a first conductive pad 425 and a second conductive pad 426 that is formed from a transition layer 422 of PCB 201. As a result, bottom clustered microvia structure 420 operates as a single electrically conductive interconnect from bottom buildup layer 417B to through-hole via 413. In some embodiments, first conductive pad 425 is disposed on exposed surface 429 of bottom buildup layer 417B or formed within bottom buildup layer 417B, and second conductive pad 426 is formed from a transition layer 422 of PCB 201.

Clustered Microvia Structure for Directly Connecting Power to an IC

Because top clustered microvia structure 410 and bottom clustered microvia structure 420 each have the capability to conduct many times more current than a single conventional microvia, multi-layer via 350 is suitable for providing power to high-performance ICs. For example, high-performance CPUs and GPUs generally that have a limited number of power connections relative to how much power is consumed. Therefore, in some embodiments, multi-layer via 350 is employed to route power from a power plane or a power component (such as a power regulator or other power-supplying device) mounted on one side of a PCB to an IC mounted on another side of a PCB. One such embodiment is described below in conjunction with FIG. 6.

Figure 5:
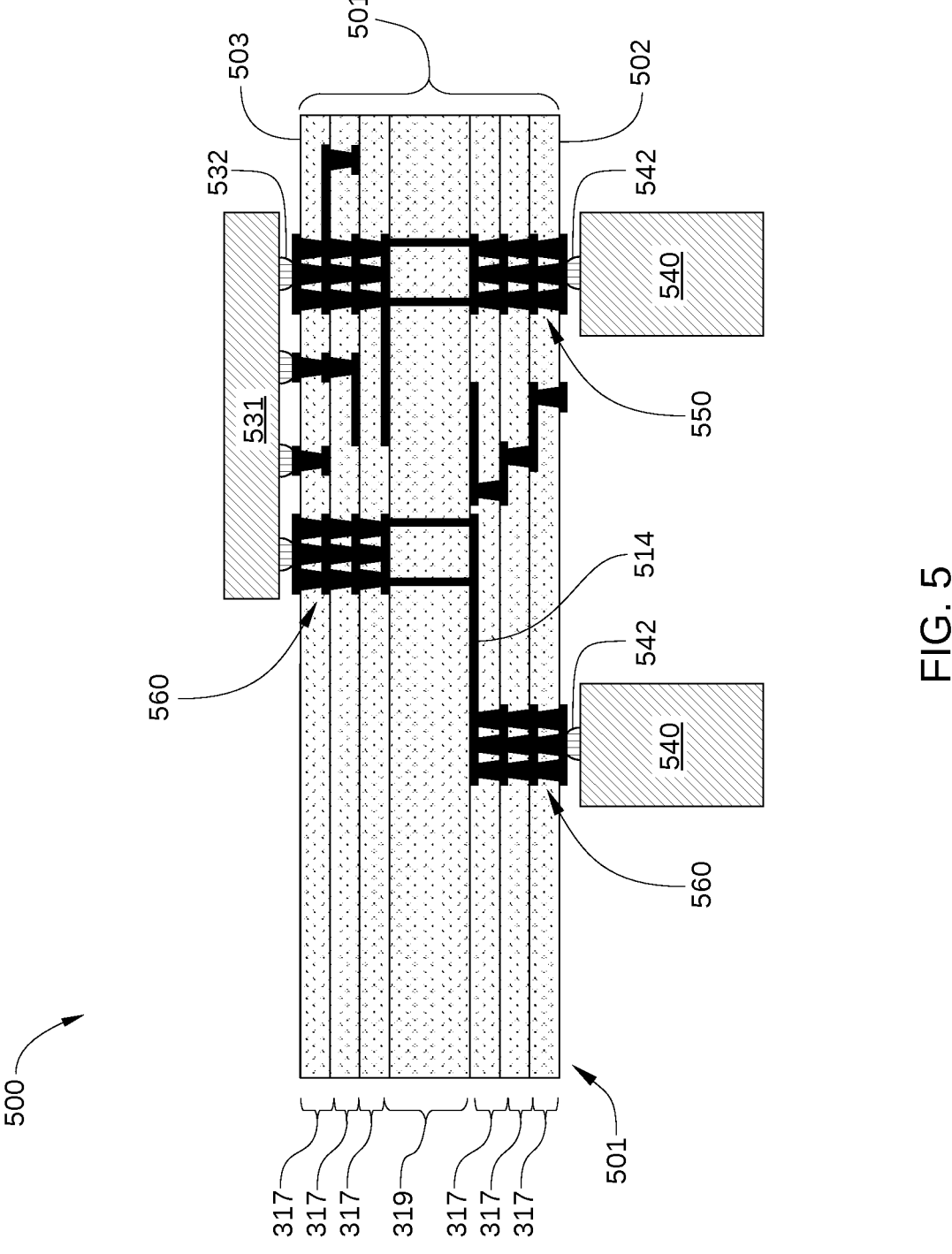
FIG. 5 is a cross-sectional view of a printed circuit board assembly that can be incorporated into the computer system of FIG. 1, according to other various embodiments.

FIG. 5 is a cross-sectional view of a PCBA 500 that can be incorporated into computer system 100, according to other various embodiments. PCBA 500 is substantially similar to PBCA 200 of FIG. 2, except that PCBA 500 includes one or more power components 540 mounted on a back side 502 of a PCB 501. For example, in some embodiments, power components 540 include one or more capacitors, inductors, and/or voltage regulator modules that are configured to provide current and voltage to one or more ICs 531 mounted on top side 503 of PCB 501.

As shown, one or more of power components 540 are electrically coupled to IC 531 with one or more multi-layer vias 550 that are configured according to various embodiments described herein. For example, in the embodiment illustrated in FIG. 5, a multi-layer via 550 is connected to a power pin or other power connection 542 of a power component 540 of PCBA 500 and to a power pin or other power connection 532 of IC IC 531. Alternatively or additionally, in some embodiments, a multi-layer via 550 is connected to a ground pin or other ground connection 543 of a power component 540 and to a ground pin or other ground connection 533 of IC IC 531. Thus, in such embodiments, each multi-layer via 550 delivers ground or power directly to IC 531 from one or more power components 540.

Alternatively or additionally, in some embodiments, one or more multi-layer vias 560 deliver ground or power to IC 531 from a power or ground plane 514. In such embodiments, high power is delivered to IC 531 using the higher power capacity associated with embodiments of multi-layer vias 560, even though power components 540 are not disposed directly opposite IC 531. Thus, in such embodiments, some or all of power components 540 can be disposed in other locations on back side surface 502 of PCB

501. In such embodiments, the need to densely pack components proximate and/or opposite IC 531 on back side surface 501 is reduced and power dissipation of PCB 501 is improved.

Clustered Microvia Structure with Stacked or Skipped Microvias

In the embodiment illustrated in FIG. 4, microvias 411 are formed through a single top buildup layer 417A. However, in some embodiments, a PCB includes multiple top buildup layers and/or multiple bottom buildup layers on a core layer of the PCB. In such embodiments, a multi-layer via suitable for providing power to a high-performance IC that is mounted on the PCB can route power and/or ground connections through the multiple buildup layers using stacked vias and/or skipped vias in a clustered microvia structure. One such embodiment is illustrated in FIG. 6.

Figure 6:
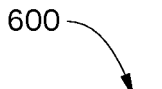
FIG. 6 is a more detailed illustration a PCBA that can be incorporated into the computer system of FIG. 1, according to various embodiments.
Figure 6:
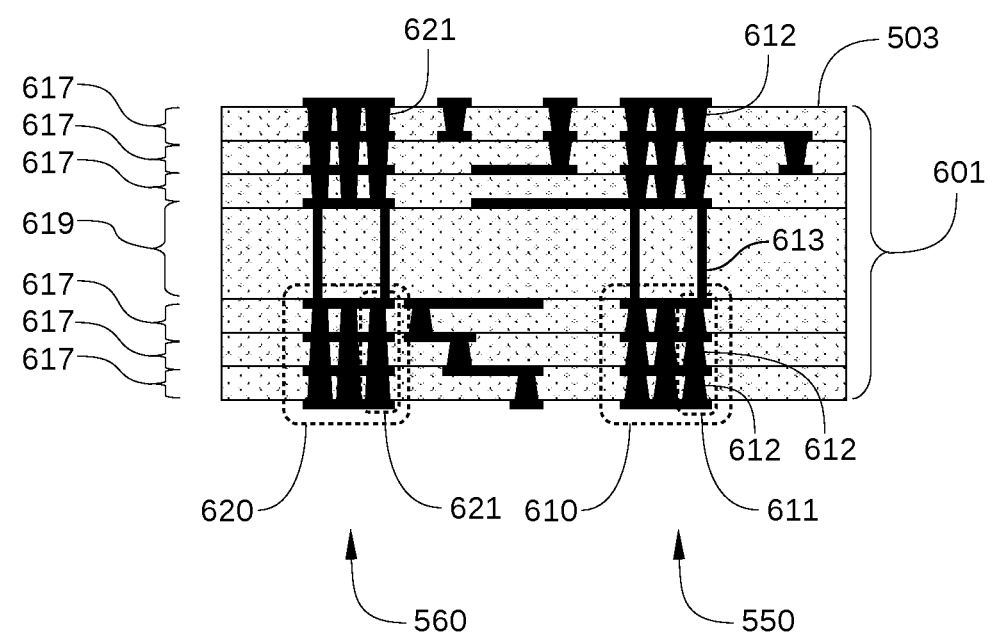

FIG. 6 is a more detailed illustration a PCBA 600 that can be incorporated into the computer system of FIG. 1, according to various embodiments. As shown, PCBA 600 includes a multi-layer via 650 formed in a PCB 601 and a multi-layer via 660 formed in PCB 601. In the embodiments illustrated in FIG. 6, multi-layer via 650 and multi-layer via 660 each span multiple buildup layers 617 of PCBA 600.

In some embodiments, multi-layer via 650 in PCB 601 includes at least one clustered microvia structure 610 that is connected to a through-hole via 613 and includes multiple stacked microvias 611. In the embodiment illustrated in FIG. 6, each stacked microvia 611 spans multiple buildup layers 617 and includes one individual microvia 612 for each of the spanned buildup layers 617. Thus, for each buildup layer 617 of PCB 601, multiple individual microvias 612 of multi-layer via 650 are formed through each buildup layer 617. For example, in an embodiment in which clustered microvia structure 610 includes a 3×3 array of nine stacked microvias 611, nine individual microvias 612 of multi-layer via 600 are formed in each buildup layer 617.

In some embodiments, multi-layer via 660 in PCB 601 includes at least one clustered microvia structure 620 that is connected to a through-hole via 613 and includes multiple skipped microvias 621. Skipped microvias 621 are generally formed in a single drilling operation, such as a laser drilling operation, penetrating two or more of buildup layers 617. In such embodiments, a different frequency of laser can be employed depending on the specific material being removed to form a particular portion of the skipped microvia. In the embodiment illustrated in FIG. 6, each skipped microvia 621 spans multiple buildup layers 617. Thus, each skipped microvia 621 is formed through multiple buildup layers 617 of PCB 601. For example, in the embodiment illustrated in FIG. 6, each skipped microvia 621 is formed through three buildup layers 617 of PCB 601.

In sum, the various embodiments shown and provided herein set forth a multi-layer via with a clustered microvia structure that includes multiple microvias. The clustered microvia structure is formed in buildup layers of a PCB and operates as a single electrically conductive interconnect through the buildup layers, for example form a top buildup layer to a buried through-hole via. In some embodiments, a multi-layer via includes a first clustered microvia structure connected to a first end of a through-hole via and a second clustered microvia structure connected to a second end of the through-hole via.

At least one technical advantage of the disclosed design relative to the prior art is that the disclosed design enables more power to be routed to a particular power connection of an IC that is mounted on a PCB. Because a cluster of multiple microvias is aligned with a single through-hole via and acts as a single conductive element, the quantity of power that can be routed through the single through-hole via is multiplied by the number of microvias in the cluster. As a result, the power that can be routed through a single through-hole via to the particular power connection of the IC is greatly increased. These technical advantages provide one or more technological advancements over prior art approaches.

1. In some embodiments a printed circuit board comprises: a buried via formed through one or more layers of the printed circuit board; a first conductive pad that is formed on a first end of the buried via; a first conductive via that is formed through a first layer of the printed circuit board and is connected to the first conductive pad; and a second conductive via that is formed through the first layer of the printed circuit board and is connected to the first conductive pad.

2. The printed circuit board of clause 1, wherein the first conductive pad is formed from a portion of a second layer of the printed circuit board.

3. The printed circuit board of clauses 1 or 2, wh6erein the second layer of the printed circuit board comprises a transition layer that is adjacent to a core layer of the printed circuit board.

4. The printed circuit board of any of clauses 1-3, wherein the first conductive via is filled with an electrically conductive material.

5. The printed circuit board of any of clauses 1-4, wherein the electrically conductive material comprises an electroplated metal.

6. The printed circuit board of any of clauses 1-5, wherein the first layer of the printed circuit board comprises either a top layer on which a processor is mounted or a bottom layer on which a power component is mounted.

7. The printed circuit board of any of clauses 1-6, wherein the top layer is included in a set of one or more layers of the printed circuit board.

8. The printed circuit board of any of clauses 1-7, wherein each of the first conductive via and the second conductive via is connected to a single conductive pad formed on the first layer of the printed circuit board.

9. The printed circuit board of any of clauses 1-8, further comprising: a second conductive pad that is formed on a second end of the buried via; a third conductive via that is formed through a second layer of the printed circuit board and is connected to the second conductive pad; and a fourth conductive via that is formed through the second layer of the printed circuit board and is connected to the second conductive pad.

10. In some embodiments, a printed circuit board comprises: a conductive via structure that includes multiple microvias, wherein the conductive via structure is formed through multiple layers of the printed circuit board and is connected to a first conductive pad formed on a first surface of the printed circuit board.

11. The printed circuit board of clause 10, further comprising a through-hole via formed through a first set of one or more layers of the printed circuit board.

12. The printed circuit board of clauses 10 or 11, wherein the multiple microvias are formed through a second set of one or more layers of the printed circuit board.

13. The printed circuit board of any of clauses 10-12, wherein the through-hole via comprises a buried via.

14. The printed circuit board of any of clauses 10-13, wherein a first set of the multiple microvias is coupled to a first end of the through-hole via and a second set of the multiple microvias is coupled to a second end of the through-hole via.

15. The printed circuit board of any of clauses 10-14, wherein the conductive via structure is connected to a second conductive pad formed on a second surface of the printed circuit board.

16. The printed circuit board of any of clauses 10-15, wherein the multiple microvias includes a first set of microvias that are connected to the first conductive pad and a second set of microvias that are connected to the second conductive pad.

17. The printed circuit board of any of clauses 10-16, further comprising a through-hole via that is disposed between the first set of microvias and the second set of microvias.

18. In some embodiments, a processing subsystem comprises: a printed circuit board (PCB) that includes: a buried via formed through one or more layers of the PCB; a first conductive pad that is formed on a first end of the buried via; a first conductive via that is formed through a first layer of the printed circuit board and is connected to the first conductive pad; and a second conductive via that is formed through the first layer of the PCB and is connected to the first conductive pad; and a processor mounted on a first side of the PCB.

19. The processing subsystem of clause 18, further comprising a power component mounted on a second side of the PCB, wherein the buried via and the second conductive via electrically couple the power component to the processor.

20. The processing subsystem of clauses 18 or 19, wherein the first conductive pad is connected to either a power connection associated with a power component or a power connection associated with the processor.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

While the preceding is directed to embodiments of the present disclosure, other and further embodiments of the disclosure may be devised without departing from the basic scope thereof, and the scope thereof is determined by the claims that follow.

What is claimed is:

1. A printed circuit board, comprising:
   a buried via formed through a core layer of the printed circuit board and having a first diameter, wherein the buried via routes a power signal;
   a first conductive pad that is formed on a first end of the buried via;
   a first conductive microvia having a cross-section filled with an electrically conductive material that:
      is formed through a first buildup layer of the printed circuit board, that
      is connected to the first conductive pad, and
      has a second diameter less than or equal to than the first diameter, wherein the first conductive microvia routes a first portion of the power signal; and
   a second conductive microvia that:
      is formed through the first buildup layer of the printed circuit board is connected to the first conductive pad, and has the second diameter, wherein the second conductive microvia routes a second portion of the power signal.

2. The printed circuit board of claim 1, wherein the first conductive pad is formed from a portion of a second layer of the printed circuit board.

3. The printed circuit board of claim 2, wherein the second layer of the printed circuit board comprises a transition layer that is adjacent to the core layer of the printed circuit board.

4. The printed circuit board of claim 1, wherein the second conductive microvia is filled with the electrically conductive material, and the first conductive microvia and the second conductive microvia route the first and second portions of the power signal from a power component by transmitting electrical currents to the buried via through the first conductive pad.

5. The printed circuit board of claim 1, wherein the electrically conductive material comprises an electroplated metal.

6. The printed circuit board of claim 1, wherein the first buildup layer of the printed circuit board comprises either a top layer on which a processor is mounted or a bottom layer on which a power component is mounted.

7. The printed circuit board of claim 6, wherein the top layer is included in a set of one or more layers of the printed circuit board.

8. The printed circuit board of claim 1, wherein each of the first conductive microvia and the second conductive microvia is connected to a single conductive pad formed on the first buildup layer of the printed circuit board.

9. The printed circuit board of claim 1, further comprising:

a second conductive pad that is formed on a second end of the buried via;

a third conductive microvia that:
is formed through a second layer of the printed circuit board,
is connected to the second conductive pad, and
routes the first portion of the power signal; and a fourth conductive microvia that:
is formed through the second layer of the printed circuit board,
is connected to the second conductive pad, and
routes the second portion of the power signal.

10. A printed circuit board, comprising:

a first conductive pad formed on a first surface of the printed circuit board;

a second conductive pad formed on a second surface of the printed circuit board;

a conductive via structure that routes a power signal and includes multiple microvias, including:
a first set of microvias that are connected to the first conductive pad, and
a second set of microvias that are connected to the second conductive pad;

wherein at least one microvia included in the multiple microvias has a cross-section filled with an electrically conductive material and routes a portion of the power signal, and wherein the conductive via structure is formed through multiple layers of the printed circuit board; and a through-hole via that is disposed between the first set of microvias and the second set of microvias.

11. The printed circuit board of claim 10, wherein the through-hole has a first diameter that is larger than one or more diameters of the multiple microvias.

12. The printed circuit board of claim 11, wherein the multiple microvias are formed through a second set of one or more layers of the printed circuit board.

13. The printed circuit board of claim 11, wherein the multiple microvias comprise multiple high density interconnect (HDI) microvias.

14. The printed circuit board of claim 11, wherein the first set of the multiple microvias is coupled to a first end of the through-hole via and the second set of the multiple microvias is coupled to a second end of the through-hole via.

15. A processing subsystem, comprising:

a printed circuit board (PCB) that includes:
a buried via formed through a core layer of the PCB and having a first diameter, wherein the buried via routes a power signal;
a first conductive pad that is formed on a first end of the buried via;
a first conductive microvia having a cross-section filled with an electrically conductive material that:
is formed through a first layer of the PCB,
is connected to the first conductive pad,
has a second diameter less than or equal to the first diameter, wherein the first conductive microvia routes a first portion of the power signal; and
a second conductive microvia that:
is formed through the first layer of the PCB,
is connected to the first conductive pad, and
has the second diameter, wherein the second conductive microvia routes a second portion of the power signal; and a processor mounted on a first side of the PCB that receives both the first portion and the second portion of the power signal.

16. The processing subsystem of claim 15, further comprising a power component mounted on a second side of the PCB, wherein the buried via and the second conductive microvia electrically couple the power component to the processor.

17. The processing subsystem of claim 15, wherein the first conductive pad is connected to either a first power connection associated with a power component or a second power connection associated with the processor.

* * * * *